United States Patent [19]

Randazzo

[11] Patent Number: 5,648,930
[45] Date of Patent: Jul. 15, 1997

[54] NON-VOLATILE MEMORY WHICH IS PROGRAMMABLE FROM A POWER SOURCE

[75] Inventor: Todd A. Randazzo, Colorado Springs, Colo.

[73] Assignee: Symbios Logic Inc., Fort Collins, Colo.

[21] Appl. No.: 674,593

[22] Filed: Jun. 28, 1996

[51] Int. Cl.$^6$ ............................................. G11C 16/06
[52] U.S. Cl. ................ 365/185.07; 365/154; 365/189.05
[58] Field of Search ........................... 365/185.07, 154, 365/156

[56] References Cited

U.S. PATENT DOCUMENTS

| | | | |
|---|---|---|---|
| 4,132,904 | 1/1979 | Harari | 365/185.07 |
| 4,663,645 | 5/1987 | Komori et al. | 357/23.5 |
| 4,775,642 | 10/1988 | Chang et al. | 437/44 |
| 4,788,663 | 11/1988 | Tanaka et al. | 365/185 |
| 4,918,501 | 4/1990 | Komori et al. | 357/23.5 |
| 4,935,802 | 6/1990 | Noguchi et al. | 357/54 |
| 4,972,371 | 11/1990 | Komori et al. | 365/185 |
| 5,065,362 | 11/1991 | Herdt et al. | 365/154 |
| 5,095,344 | 3/1992 | Harari | 357/23.5 |
| 5,098,855 | 3/1992 | Komori et al. | 437/52 |
| 5,153,144 | 10/1992 | Komori et al. | 437/43 |
| 5,172,200 | 12/1992 | Muragishi et al. | 257/315 |
| 5,172,338 | 12/1992 | Mehrotra et al. | 365/185 |
| 5,189,640 | 2/1993 | Huard | 365/154 |
| 5,194,924 | 3/1993 | Komori | 257/316 |
| 5,220,533 | 6/1993 | Turner | 365/218 |
| 5,241,498 | 8/1993 | Yokokura | 365/185 |
| 5,267,209 | 11/1993 | Yoshida | 365/218 |
| 5,278,794 | 1/1994 | Tanaka et al. | 365/200 |
| 5,280,446 | 1/1994 | Ma et al. | 365/185 |
| 5,283,759 | 2/1994 | Smith | 365/185 |
| 5,299,162 | 3/1994 | Kim et al. | 365/201 |
| 5,352,620 | 10/1994 | Komori et al. | 437/52 |
| 5,353,248 | 10/1994 | Gupta | 365/154 |
| 5,355,007 | 10/1994 | Smayling | 257/231 |
| 5,361,224 | 11/1994 | Takasu | 365/156 |
| 5,373,465 | 12/1994 | Chen et al. | 365/185 |
| 5,386,422 | 1/1995 | Endoh et al. | 371/21.5 |
| 5,399,917 | 3/1995 | Allen et al. | 327/436 |
| 5,412,238 | 5/1995 | Chang | 257/321 |
| 5,453,388 | 9/1995 | Chen et al. | 437/30 |
| 5,455,790 | 10/1995 | Hart et al. | 365/185.11 |
| 5,460,998 | 10/1995 | Liu | 437/57 |

*Primary Examiner*—David C. Nelms
*Assistant Examiner*—Michael T. Tran
*Attorney, Agent, or Firm*—John R. Ley; David K. Purks; Wayne P. Bailey

[57] ABSTRACT

An apparatus and method for storing a momentarily applied binary signal in a non-volatile memory cell and for automatically returning to a state which is indicative of the applied binary signal upon power-up of the non-volatile memory. In one aspect, the non-volatile memory is connected to first and second power busses between which a power source supplies an operating voltage and a programming voltage of a substantially greater magnitude than the operating voltage. The non-volatile memory comprises a memory circuit which is connected between the first and second power busses. The memory circuit includes an input node, an output node, and a non-volatile element which is connected to the input and output nodes. The memory circuit responds to an input binary signal from the input node by latching in a first binary state which is indicative of the input binary signal. The non-volatile element responds to the programming voltage between the first and second power busses by storing the first binary state non-volatilely. After any interruption in power supplied in the first and second power busses, the non-volatile element latches the memory circuit in a binary state which is indicative of the first binary state.

6 Claims, 5 Drawing Sheets

NON-VOLATILE MEMORY WHICH IS PROGRAMMABLE FROM A POWER SOURCE

FIELD OF THE INVENTION

This invention relates to non-volatile semiconductor memory and, more particularly, to a memory cell having a non-volatile memory element and which is programmable, in response a variation in voltage from a power source, to store a received binary signal non-volatilely and allow the received binary signal to be recovered after any interruption in power from the power source.

BACKGROUND OF THE INVENTION

A non-volatile semiconductor memory provides permanence for stored digital values by retaining any stored digital values when electrical power to the memory is interrupted. Non-volatile semiconductor memory has been integrated with circuitry in linear (i.e. analog) and digital products to store digital values, such as trim values in precision linear circuits, preferred logic configurations, micro-code, or product identification codes.

Two common types of non-volatile semiconductor memories are electrically programmable read-only memories (EPROMs) and electrically erasable programmable read-only memories (EEPROMs). These memories typically include an array of hundred of thousands or millions of non-volatile memory cells.

Complex ancillary circuitry is typically required to program, erase, and read a binary value in a memory cell within an array of memory cells. Ancillary transistor circuitry controls access to the memory cells so that only one memory cell can be selected at a time for programming or reading of a logic value. The ancillary transistor circuitry also supplies voltage levels to the selected memory cell that are different from the voltage levels that are supplied to other memory cells, in order to program, erase, or read a binary value of the selected memory cell.

The requirement for ancillary circuitry can make integration of the non-volatile memory into linear and digital products prohibitively expensive and time consuming, especially when small quantities of non-volatile memory are desired. The ancillary circuitry occupies space on the semiconductor substrate and, thereby, decreases the space available for other linear or digital circuitry. The ancillary circuitry further decreases the reliability of the product over any decrease due to the integrated memory elements.

Since each memory cell in the memory array must be separately selected before the binary value in the memory cell can be read, the binary value in each memory cell is not immediately output as a logical signal to any integrated circuitry in the product upon power-up of the non-volatile semiconductor memory.

It is with respect to this and other background information that the present invention has evolved.

SUMMARY OF THE INVENTION

An object of the present invention is to provide a non-volatile memory cell that immediately supplies a reprogrammable preferred logical signal to any integrated circuitry upon power-up of the non-volatile memory cell. A further object is to provide a non-volatile memory cell in which a binary value can be programmed, erased, and sensed in the memory cell without using ancillary circuitry for selecting the memory cell or for supplying voltage levels to the memory cell that are different from voltage levels supplied to other memory cells.

The present invention is directed to a non-volatile memory cell which is connected to first and second power busses between which a power source supplies an operating voltage and a programming voltage of a substantially greater magnitude than the operating voltage. The non-volatile memory comprises a memory circuit which is connected between the first and second power busses. The memory circuit includes an input node, an output node, and a non-volatile element which is connected to the input and output nodes. The memory circuit responds to an input binary signal from the input node by latching in a first binary state which is indicative of the input binary signal. The non-volatile element responds to the programming voltage between the first and second power busses by storing the first binary state non-volatilely. After any interruption in power supplied in the first and second power busses, the non-volatile element latches the memory circuit in a binary state which is indicative of the first binary state. In this manner, the memory circuit selectively stores a binary signal, in a non-volatile manner, in response to a substantial increase in the voltage between the power busses. Consequently, a plurality of the memory cells can be connected between the same power busses and programmed at substantially the same time by varying the magnitude of the voltage between the power busses.

According to a further aspect of the present invention, the memory circuit is responsive to an initial supply of power on the first and second busses, following an interruption in power, to supply a second binary signal, which is indicative of the first binary signal, on the output of the memory circuit. In this manner, the memory circuit immediately outputs a stored binary signal upon power up of the non-volatile memory cell.

According to further aspects of the present invention, the memory circuit comprises cross-coupled first and second invertors. The first invertor has an input terminal connected to the input node of the non-volatile memory cell, and an output terminal. The second inverter has an input terminal connected to the output terminal of the first inverter and an output terminal connected to the input terminal of the first inverter. In response to the input signal being applied to the input node of the non-volatile memory, the cross-coupling between the invertors causes the first inverter to latch in the first binary state and the second inverter to latch in a second binary state which is different from the first binary state.

The first and second invertors each include a non-volatile element which is operative to non-volatilely retain a programmed binary state during any interruption in power in the first and second power busses. After a power interruption, the non-volatile elements are operative to return the first inverter to a state which is indicative of the first binary state and the second inverter to a state which is indicative of the second binary state.

The present invention is also directed to a method of programming a binary state in a non-volatile memory which is connected between first and second power busses between which a power source supplies an operating voltage and a programming voltage of substantially greater magnitude than the operating voltage. The non-volatile memory includes an input node, an output node, and a non-volatile element which is connected to the input and output nodes. An input binary signal is applied to an input node of the non-volatile memory. In response to the input binary signal, a first binary state, which is indicative of the input binary signal, is established in the non-volatile memory. In response to the programming voltage between the first and second power busses, the first binary state is stored non-volatilely in the non-volatile element so that the non-volatile memory retains the first binary state during any interruption in power in the first and second power busses. Upon power-up of the non-volatile memory, a binary state is established in the non-volatile memory which is indicative of the first binary state.

A more complete appreciation of the present invention and its scope can be obtained by reference to the accompanying drawings, which are briefly summarized below, the following detailed description of presently preferred embodiments of the invention, and the appended claims.

DETAILED DESCRIPTION

Figure 1:
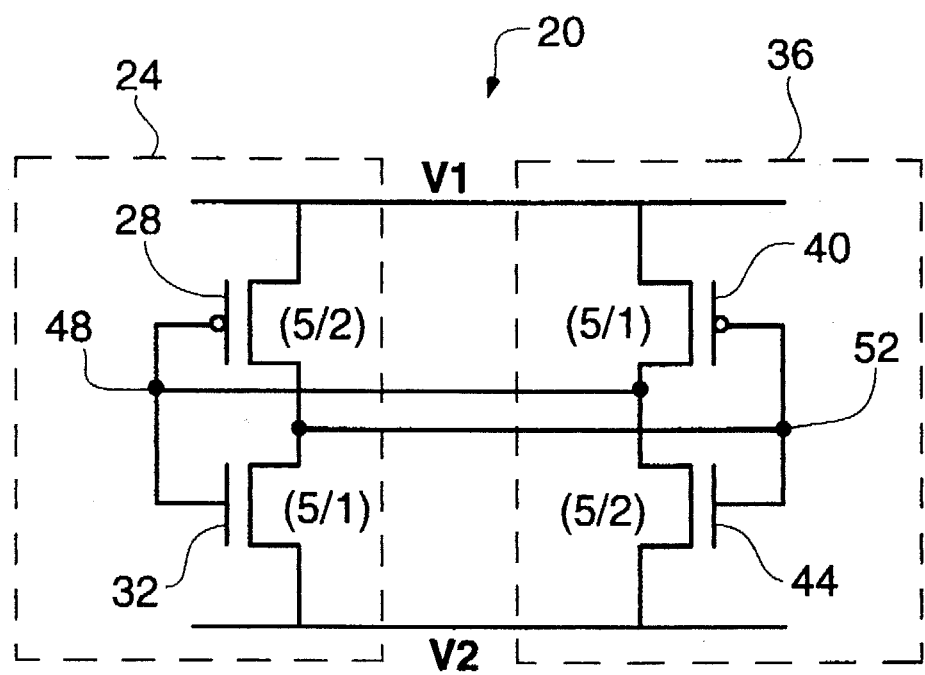
FIG. 1 is a schematic diagram of a prior art volatile CMOS memory cell that powers up in a preferred state.

A prior art CMOS memory cell 20 is shown in FIG. 1. The CMOS memory cell 20 is formed from cross-coupled invertors 24 and 36 which have asymmetric switch points. The first inverter 24 is formed from a pair of field effect transistors (FETs) 28 and 32 which have respective gate width/length ratios of 5/2 and 5/1. The second inverter 36 is similarly formed from a pair of transistors 40 and 44 which have respective gate width/length ratios of 5/1 and 5/2. The opposite arrangement of the gate width/length ratios of the first and second invertors, 24 and 36, causes the first inverter 24 to have a different switch point, i.e. unity gain point, than the second inverter 36. With the gate width/length ratios shown in FIG. 1, the first inverter 24 has a lower switch point than the second inverter 36. The first and second invertors 24 and 36 are cross-coupled so that the asymmetric switch points cause the CMOS memory cell 20 to power-up with the preferred state in which node 48 of the first inverter 24 has the V1 voltage and node 52 of the second inverter 36 has the V2 voltage. While this technique enables the memory cell 20 to power-up in a preferred binary state, the preferred binary state is programmed using lithographic masks during manufacturing and cannot be later reprogrammed.

Figure 2:
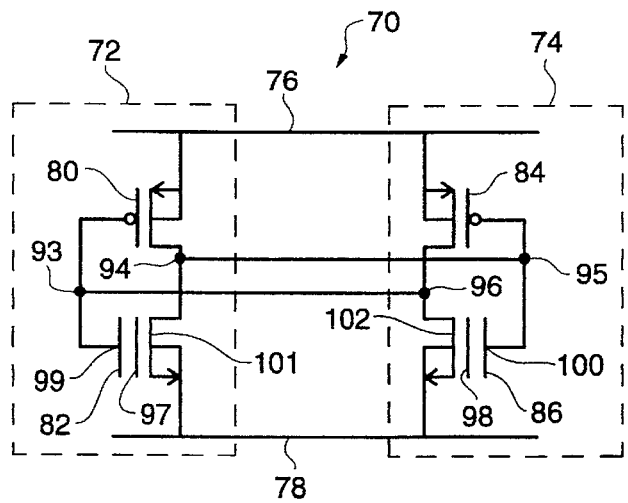
FIG. 2 is a schematic diagram of a non-volatile memory cell having N-channel floating gate transistors according to the present invention.

The features of the present invention are preferably embodied in a memory cell 70 that includes a first inverter 72 and a second inverter 74 which are cross-coupled as shown in FIG. 2. The first and second invertors 72 and 74 are connected between a VDD buss 76 through which current is supplied or drawn from a power source (not shown) and a VSS buss 78 through which current is returned to the power source. In contrast to FIG. 1, the first invertor 72 includes a P channel transistor 80 connected to an N channel floating gate transistor 82. In further contrast to FIG. 1, the second invertor 74 includes a P channel transistor 84 connected to an N channel floating gate transistor 86.

The first inverter 72 has an input node 93 and an output node 94. The second inverter 74 has an input node 95 and an output node 96. As shown in FIG. 2, the invertors 72 and 74 are cross-coupled to function as a latch. In particular, input node 93 of the first inverter 72 is connected to output node 96 of the second inverter 74 and input node 95 of the second inverter 74 is connected to output node 94 of the first inverter 72.

In response to a binary signal being supplied to the input node 93 of the first inverter 72, the input 93 is driven to the same binary value as the supplied binary signal and the output 95 of the first inverter 72 is driven to the opposite binary value. The output 94 of the first inverter 72 drives the input 95 of the second inverter 74 to the opposite binary value. Consequently, the first inverter 72 becomes latched in a binary state which is indicative of the logical value of the supplied binary signal while the second inverter 74 becomes latched in an opposite binary state which is indicative of the opposite logical value. The latched binary states of the invertors 72 and 74 are selectively stored in the floating gate transistors 82 and 86 so that, after an interruption in the power in the VDD and VSS busses 76 and 78, the first and second invertors 72 and 74 will return to binary states which are indicative of the stored binary states.

The floating gate transistors 82 and 86 each have a floating gate, 97 and 98, a control gate, 99 and 100, and a drain-source channel, 101 and 102, respectively. The binary state of each of the floating gate transistors 82 and 86 depends upon the presence or absence of a threshold amount of trapped charge in the floating gates 97 and 98, as is well known. The floating gate transistors 82 and 86 are preferably enhancement mode devices in which a threshold voltage must be applied to the control gates 99 and 100 to cause the drain-source channels 101 and 102 to become conductive. The presence of trapped charge in the floating gates 97 and 98 increases the magnitude of the threshold voltage which is required to trigger the transistor into conduction. When the trapped charge in the floating gates 97 and 98 is less than a threshold amount and when a normal operating voltage (i.e. a voltage magnitude which is substantially less than a programming voltage level) is applied to the control gates 99 and 100, the drain-source channels 101 and 102 are conductive. Conversely, when the trapped charge in the floating gates 97 and 98 is at least equal to the threshold amount and a normal operating voltage is applied to the control gates 99 and 100, the drain-source channels 101 and 102 are non-conductive. In this manner, the logical state stored in the floating gate transistors 82 and 86 is represented by the conductivity of the drain-source channels 101 and 102 when a voltage within a range of the normal operating voltages is applied to the control gates 99 and 100.

The floating gate transistors 82 and 86 are programmed when a sufficient number of electrons are injected from the drain-source channels 101 and 102 to the floating gates 97 and 98 so as to increase the threshold voltages above a predetermined threshold voltage. Similarly, the floating gate transistors 82 and 86 are erased when a sufficient number of electrons are emitted from the floating gates 97 and 98 to the drain-source channels 101 and 102 to decrease the threshold voltages below the predetermined threshold voltage.

When the floating-gate transistors 82 and 86 are both erased, the first and second invertors 72 and 74 have symmetrical switch points. Programming one of the floating-gate transistors 82 and 86 causes the invertors 72 and 74 to have asymmetric switch points so that the memory cell 70 powers up with a preferred binary state. The cross-coupling of the invertors 72 and 74 causes floating-gate transistor 82 to be programmable to the complementary state of floating gate transistor 86. The circuitry and method for programming and erasing the floating gate transistors 82 and 86 are discussed later in this detailed description.

Figure 3:
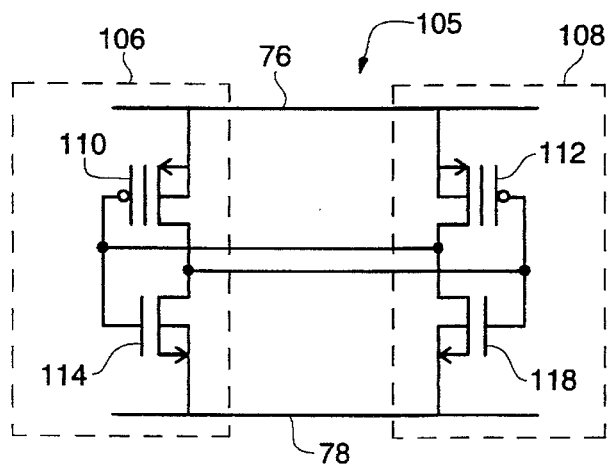
FIG. 3 is a schematic diagram of a non-volatile memory cell having P-channel floating gate transistors according to the present invention.

According to another embodiment shown in FIG. 3, a non-volatile memory cell 105 includes a cross-coupled first invertor 106 and second invertor 108, which, in contrast to FIG. 2, are formed from P-channel floating gate transistors 110 and 112 and N-channel transistors 114 and 118. In another embodiment shown in FIG. 4, a non-volatile memory cell 120 includes a cross-coupled first invertor 124 and second invertor 128, which, in contrast to FIGS. 2 and 3, are formed from P-channel floating gate transistors 132 and 136 and N-channel floating gate transistors 140 and 144. Similar to the memory cell 70 shown in FIG. 2, the memory cells 105 and 120, shown in FIGS. 3 and 4, are programmable to power up with a preferred binary state.

Figure 4:
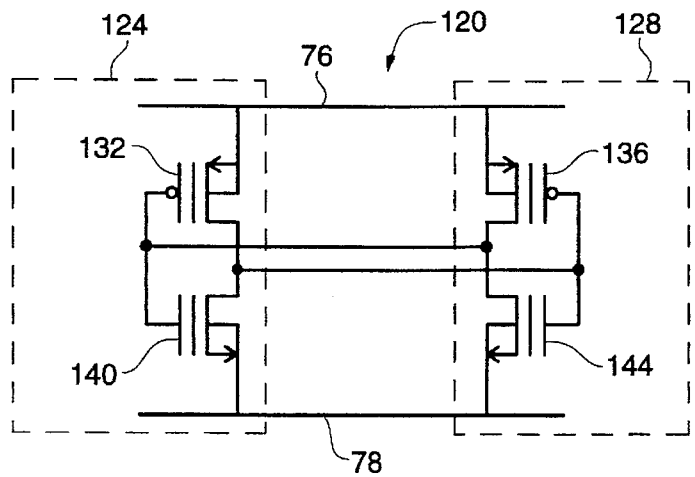
FIG. 4 is a schematic diagram of a non-volatile memory cell having both N-channel floating gate transistors and P-channel floating gate transistors according to the present invention.

The memory cells of FIGS. 2–4 can have either EPROM or EEPROM characteristics by using, for example, conventional ultraviolet-erasable electrically-programmable floating gate transistors or electrically-erasable electrically-programmable floating gate transistors, respectively, in the illustrated cross-coupled invertors. For an EEPROM type memory cell, each invertor preferably includes an additional transistor that serves to prevent the memory cell from conducting an excessive amount of current in the event that one or more of the electrically erasable floating gate transistors has been over-erased into a depletion mode. The additional transistors are enhancement mode type transistors that have the same drain-source channel type as the floating gate transistors to which they are connected. Further embodiments of the memory cells shown in FIGS. 2–4, which include the additional transistors for depletion mode protection, are shown in FIGS. 5–7 using the same numbering for the same elements as is shown in the otherwise corresponding FIGS. 2–4.

Figure 5:
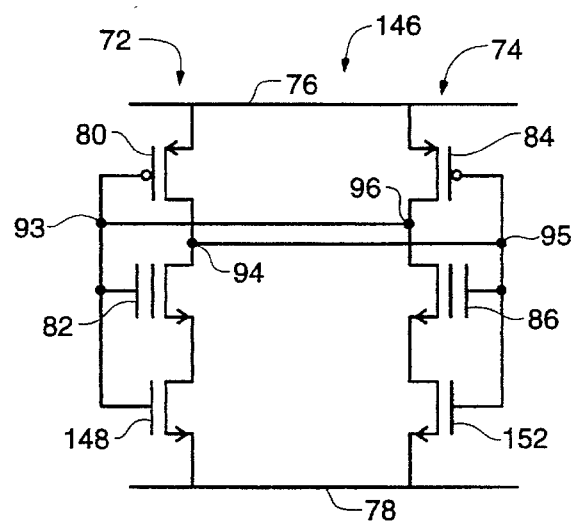
FIG. 5 is a schematic diagram of a preferred EEPROM embodiment of the non-volatile memory cell shown in FIG. 2.

FIG. 5 shows an EEPROM type memory cell 146 that achieves depletion mode protection for the electrically erasable N-channel floating gate transistors 82 and 86 using a pair of N-channel enhancement mode transistors 148 and 152. The drain-source channel of transistor 148 is connected in series between the drain-source channel of floating-gate transistor 82 and the VSS buss 78. The drain-source channel of transistor 152 is connected in series between the drain-source channel of floating-gate transistor 86 and the VSS buss 78. The control gates of the depletion protection transistors 148 and 152 are connected to the input nodes of the corresponding invertors 72 and 74, as shown in FIG. 5. Due to the cross coupling of the invertors 72 and 74, one of the floating gate transistors, 82 and 86, is erased while the other one of the floating gate transistors, 82 and 86, is programmed. Furthermore, the erased floating gate transistor is within the inverter which has the VSS level input node. With the input node at the VSS level, the control gate of the depletion protection transistor which is connected in series with the erased floating gate transistor is also at the VSS level. Consequently, even if the erased floating gate transistor is in a depletion mode, the depletion protection transistor prevents current from flowing between the VDD and VSS busses, 76 and 78, through the erased floating gate transistor.

Figure 6:
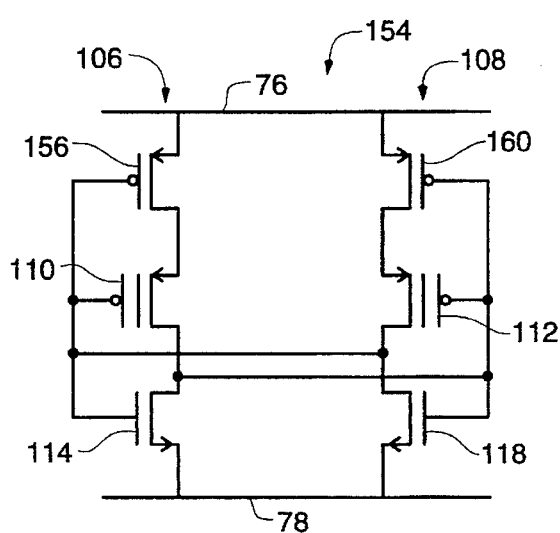
FIG. 6 is a schematic diagram of a preferred EEPROM embodiment of the non-volatile memory cell shown in FIG. 3.
Figure 7:
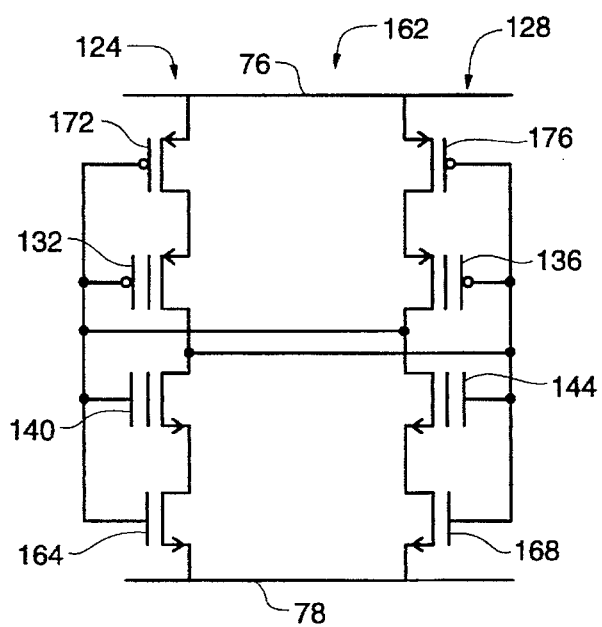
FIG. 7 is a schematic diagram of a preferred EEPROM embodiment of the non-volatile memory cell shown in FIG. 4.

Depletion mode protection is provided for the memory cell 98 shown in FIG. 3 using a pair of P-channel enhancement mode transistors 156 and 160 which are connected in series with the electrically erasable P-channel floating gate transistors 110 and 112, as shown in FIG. 6 for memory cell 146. Similarly, depletion mode protection is provided for the memory cell 120 shown in FIG. 4 using a pair of N-channel enhancement mode transistors 164 and 168 which are connected in series with the electrically erasable N-channel floating gate transistors 140 and 144 and using a pair of P-channel enhancement mode transistors 172 and 176 which are connected in series with the electrically erasable P-channel floating gate transistors 132 and 136, as shown in FIG. 7 for memory cell 162. A memory cell formed according to the embodiments shown in FIGS. 2–7 can be easily integrated with CMOS and BICMOS linear or digital circuitry to supply a programmable preferred binary value to the other circuitry upon power-up. The memory cell is integrated with other circuitry by connecting the VDD and VSS power busses, 76 and 78, of the memory cell to the corresponding power busses of the other circuitry and connecting the output node of one of the invertors in the memory cell to a node within the other circuitry at which the preferred binary value is to be supplied. Upon power-up of the power busses of the other circuitry, the memory cell supplies a binary value, which is indicative of the programmed state of the connected invertor, to the connected node within the other circuitry. Alternately, the VDD and VSS power busses, 76 and 78, can be connected to power busses that are separate from the power busses of the other circuitry. A plurality of the memory cells can be integrated with other circuitry by connecting an output node of an invertor in each of the plurality of memory cells to different nodes within the other circuitry.

Figure 8:
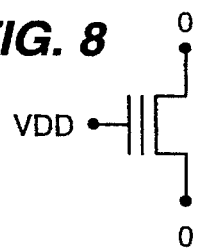
FIG. 8 is a schematic diagram of the signals supplied to program the N-channel floating gate transistors shown in FIGS. 2, 4, 5 and 7.
Figure 9:
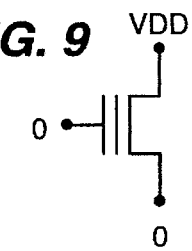
FIG. 9 is a schematic diagram of the signals supplied to the N-channel floating gate transistors shown in FIGS. 2, 4, 5, and 7 to erase the EEPROM type elements while not erasing the EPROM type elements.
Figure 10:
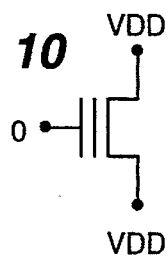
FIG. 10 is a schematic diagram of the signals supplied to program the P-channel floating gate transistors shown in FIGS. 3, 4, 6 and 7.
Figure 11:
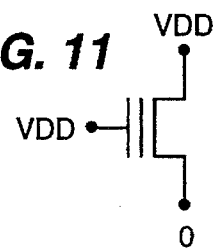
FIG. 11 is a schematic diagram of the signals supplied to the P-channel floating gate transistors shown in FIGS. 3, 4, 6, and 7 to erase the EEPROM type elements while not erasing the EPROM type elements.

A memory cell that is integrated with other circuitry can be programmed by controlling the magnitude of the voltages on the power busses of the other circuitry and, thereby, the magnitude of the VDD and VSS voltages of the memory cells. To facilitate programming of the memory cell using the VDD and VSS voltages, the floating gate transistors preferably exhibit the three electrical conditions that are described below in conjunction with FIGS. 8–11. FIGS. 8 and 9 illustrate the electrical conditions which are preferably exhibited by the N-channel floating gate transistors while FIGS. 10 and 11 illustrate the electrical conditions which are preferably exhibited by the P-channel floating gate transistors.

A first electrical condition that is preferably exhibited by the floating gate transistors is that the binary state of the floating gate transistor (i.e. high threshold voltage or low threshold voltage) is not changed when normal operating voltage levels of the integrated other circuitry are supplied through the power busses to the floating gate transistor. In particular, the threshold voltage of the floating gate transistor remains substantially unchanged when voltage signals are supplied to the floating gate transistor as shown in FIGS. 8–11 and when VDD is within the range of normal operating voltage levels for the other circuitry.

A second electrical condition that is preferably exhibited by the floating gate transistors is that a binary state is programmed in the floating gate transistor by momentarily supplying a power buss voltage that is substantially greater than the normal operating voltage of the integrated circuitry. In particular, when voltage signals are supplied to the floating gate transistor as shown in FIGS. 8 or 10, and when VDD is substantially greater than the normal operating voltage of the integrated circuitry (i.e. 1.5 to 5 times greater than the normal operating voltage), a sufficient number of electrons tunnel into the floating gate of an N-channel transistor or tunnel out of the floating gate of a P-channel transistor to cause the threshold voltage of the floating gate transistor to substantially increase.

A third electrical condition which is preferably exhibited by the floating gate transistors is that EEPROM type floating gate transistors are erased. (i.e. acquire a low threshold voltage level), while EPROM type floating gate transistors are not erased (i.e. maintain the preexisting threshold voltage level), when voltages are supplied as shown in FIGS. 9 or 11 and when VDD is substantially greater than the normal operating voltage of the integrated circuit (i.e. 1.5 to 5 times greater than the normal operating voltage).

Figure 12:
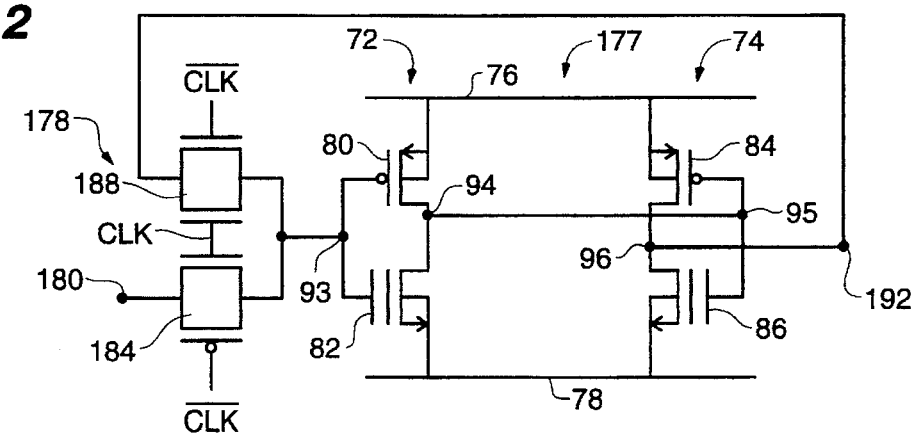
FIG. 12 is a schematic diagram of an embodiment of the memory cell shown in FIG. 2 in which programing is performed using the power supply voltages.
Figure 13:
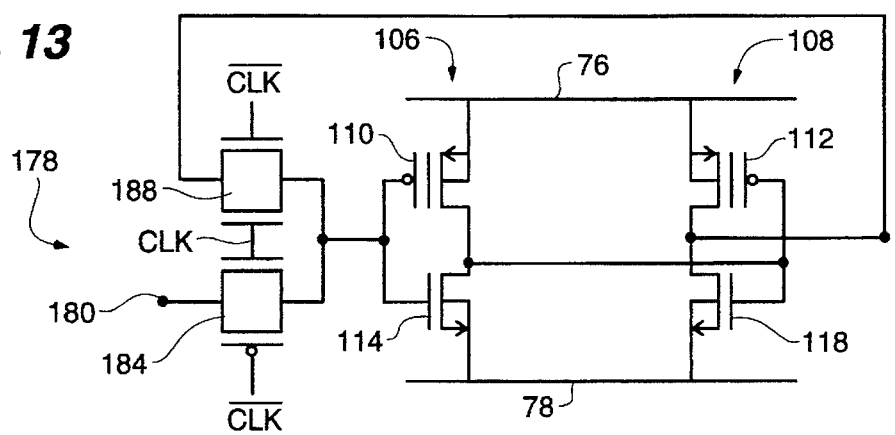
FIG. 13 is a schematic diagram of an embodiment of the memory cell shown in FIG. 3 in which programing is performed using the power supply voltages.
Figure 14:
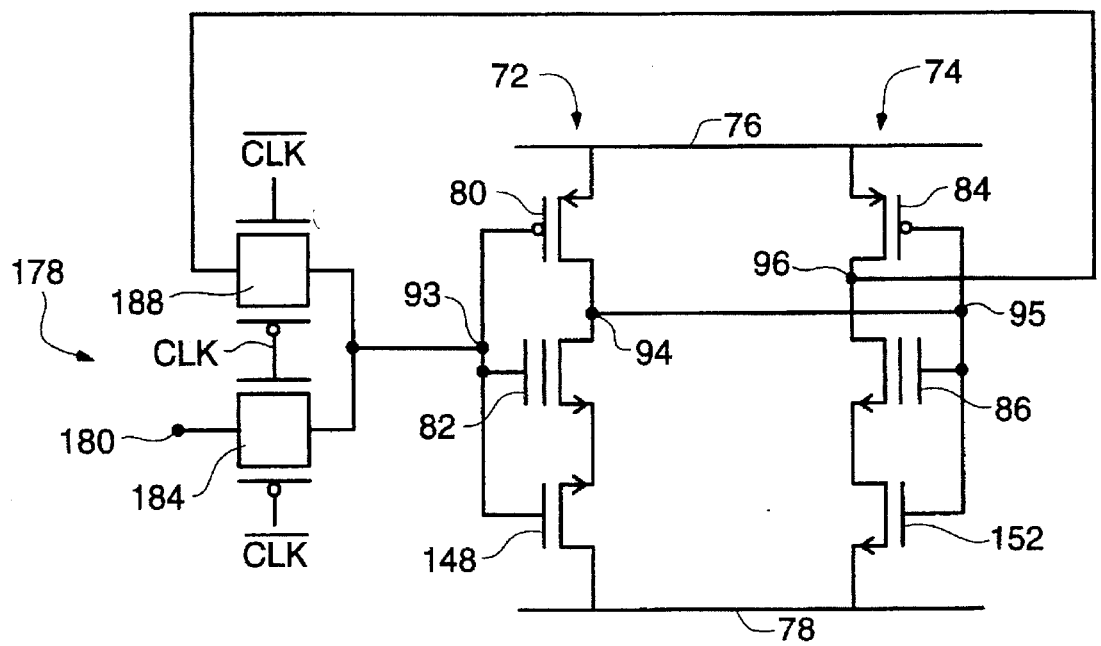
FIG. 14 is a schematic diagram of an embodiment of the memory cell shown in FIG. 5 in which programing is performed using the power supply voltages.
Figure 15:
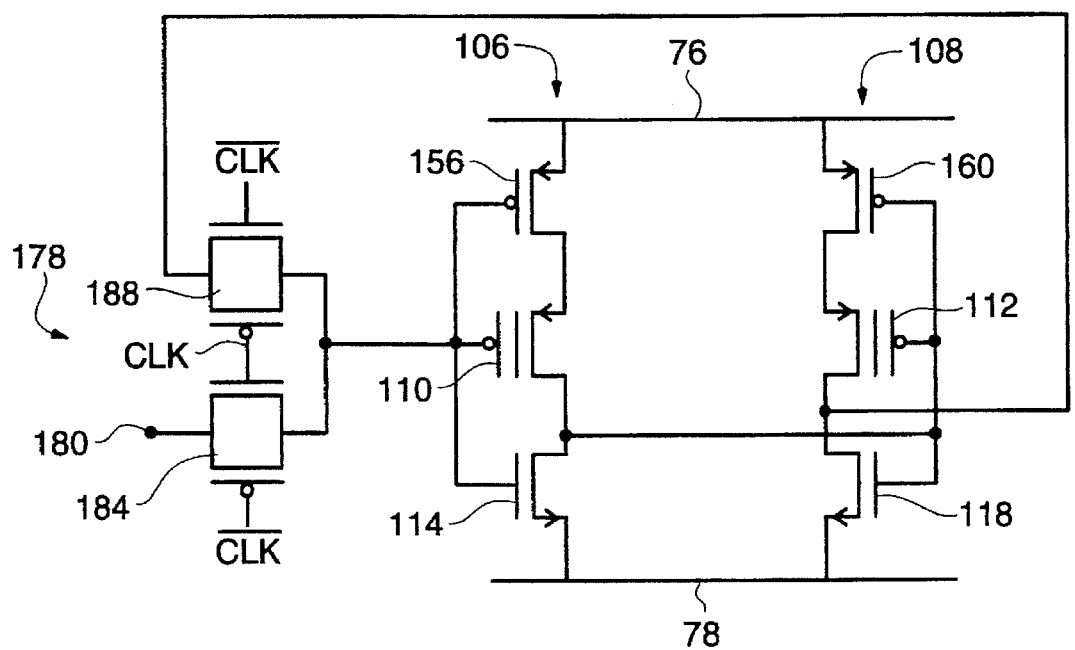
FIG. 15 is a schematic diagram of an embodiment of the memory cell shown in FIG. 6 in which programing is performed using the power supply voltages.

The memory cells shown in FIGS. 2, 3, 5 and 6 have been modified as shown in FIGS. 12, 13, 14, and 15, respectively, for use with other sequential logic circuitry. FIGS. 12–15 use the same numbering for the same elements as shown in the corresponding FIGS. 2, 3, 5, and 6. The process for programming a binary signal into the memory cell of FIG. 12 is described below. The memory cells embodied in FIGS. 13–15 are programmed in the same manner as described for the memory cell of FIG. 12.

As shown in FIG. 12, a memory cell 177 includes the pair of invertors 72 and 74 from FIG. 2 and a multiplexer 178. The memory cell 177 has an input/output node 180 which can be connected to a node within other circuitry to receive and store a binary signal from the connected node and to supply thereto a programmed binary signal upon power up of the memory cell 177. The multiplexer 178 includes a pair of buffers 184 and 188. One of the buffers 184 is connected between the input/output node 180 and the input node 93 of the first invertor 72. The other one of the buffers 188 is connected between the output node 96 of the second invertor 74 and the input node 93 of the first invertor 72. Buffer 184 alternates between a conductive state and a nonconductive state in response to a clock signal (CLK) alternating between a logic zero value and a logic one value, respectively. In contrast, buffer 188 alternates between a conductive state and a nonconductive state in response to the CLK signal alternating between a logic one value and a logic zero value, respectively. Consequently, the multiplexer 178 alternately connects the input 93 of the first invertor 72 to the input/output node 180 and to the output node 96 of the second invertor 74 in response to the CLK signal.

A binary signal (i.e. either VDD or VSS) that is to be programmed into the memory 177 is initially supplied to the input 180 of the buffer 184 while the CLK signal has a logic zero value. In response to the supplied binary signal, the input 93 of the first inverter 72 is driven to the same binary value as the supplied binary signal while the input 95 of the second inverter 74 is driven to the other opposite binary value. The logical states of the invertors 72 and 74 are latched by transitioning the CLK signal to a logic one value so that the output 96 of the second inverter 74 is connected to the input 93 of the first inverter 72.

The latched states of the invertors 72 and 74 are then stored within the floating gate transistors 82 and 86 so that, after a power interruption, the invertors 72 and 74 will return to states which are indicative of the states of the invertors before the power interruption. The latched states of the invertors 72 and 74 are stored within the floating gate transistors 82 and 86 by raising VDD to the programming voltage level of the floating gate transistors 82 and 86 (i.e. 1.5 to 5 times the normal operating voltages). Since the invertors 72 and 74 are latched in opposite binary states, the floating gate transistor in one of the invertors, 72 and 74, is programmed (i.e. substantially increased threshold voltage) while the floating gate transistor in the other one of the invertors, 72 and 74, is erased i.e. substantially decreased threshold voltage). After a power interruption, the floating gate transistor which was erased to a lower threshold voltage becomes conductive before the floating gate transistor which was programmed to a higher threshold voltage. Consequently, the invertors, 72 and 74, become latched in binary states that are opposite to the binary states that were latched in the invertors, 72 and 74, before the power was interrupted. A particular example of how a binary signal is programmed in the memory cell 177 of FIG. 12 is described below.

With the invertors 72 and 74 of the memory cell 177 receiving power from the VDD and VSS power busses, 76 and 78, and the CLK signal at a VSS voltage level, a logic zero value is supplied as a VSS voltage level signal to the input 180 of the buffer 184. The supplied VSS signal is conducted through the buffer 184 to the input 93 of the first inverter 72. The supplied VSS signal drives the input 93 of the first inverter 72 to a VSS level. With the input 93 at the VSS level, transistor 80 conducts the VDD voltage from the VSS power buss 76 to the input 95 of the second inverter 74. After the invertors 72 and 74 have stabilized, the CLK signal is raised from the VSS level to the VDD level. With the CLK signal at the VDD level, the output 96 of the second inverter 74 is connected through buffer 188 to the input 93 of the first inverter 72 so that the logical states of the first and second invertors, 72 and 74, become latched. Consequently, input 93 of the first inverter 72 is latched at the supplied VSS level while the input 95 of the second inverter 74 is latched at the opposite VDD level.

The latched states of the invertors 72 and 74 are stored in the floating gate transistors 82 and 86 by raising the voltage of the VDD buss 76 to the programming voltage level. With the VDD buss 76 at the programming voltage level, the floating gate transistor 82 is biased as shown in FIG. 9 so that it becomes erased (i.e. its threshold voltage decreases below the predetermined threshold voltage) while floating gate transistor 86 is biased as shown in FIG. 8 so that it becomes programmed (i.e. its threshold voltage increases above the predetermined threshold voltage).

Following an interruption of power on the VDD and VSS busses, 76 and 78, floating gate transistor 82, which has a lower threshold voltage than floating gate transistor 86, becomes conductive before the floating gate transistor 86 and latches the input 93 of the first inverter 72 at the VDD level and the input 95 of the second inverter 74 at the VSS level. Consequently, after the power interruption, the invertors 72 and 74 are returned to binary states that are opposite to what they possessed prior to the power interruption.

In this manner a new and improved non-volatile memory cell has been described that outputs a programmable preferred binary signal upon power-up of the memory cell. Furthermore, the preferred binary signal is easily programmed by varying the magnitude of the voltages which are supplied on power busses to the memory cell. Consequently, a semiconductor device can be constructed in which a plurality of the non-volatile memory cells are integrated with CMOS or BICMOS linear and digital circuitry and which are programmable to supply a preferred binary value to the integrated circuitry upon power-up of the device. Additionally, the plurality of non-volatile memory cells are programmable at substantially the same time by varying the voltages which are supplied on the power busses to the semiconductor device.

A presently preferred embodiment of the invention and its improvements have been described with a degree of particularity. This description has been made by way of preferred example. It should be understood that the scope of the present invention is defined by the following claims, and should not necessarily be limited by the detailed description of the preferred embodiment set forth above.

The invention claimed is:

1. A programmable non-volatile memory cell integrally connected to a sequential logic element in an semiconductor integrated circuit to establish a predetermined programmed non-volatile initial state of the memory cell and a predetermined operating state of the sequential logic element related to the non-volatile initial state of the memory cell as a result of an initial application of an operating voltage to the integrated circuit, the integrated circuit having power busses connected to the memory cell and the sequential logic element and between which the operating voltage is supplied, the integrated circuit selectively supplying a programming voltage of a magnitude greater than the operating voltage on the power busses to program selectively the non-volatile state of the memory cell, the integrated circuit also supplying a clock signal which alternates between high and low levels on a periodic basis in cycles, the memory cell comprising:

first and second inverters connected between the power busses, each inverter including an input terminal and an output terminal and a non-volatile element connected to the input and output terminals and to the power busses, each non-volatile element capable of being programmed to a predetermined non-volatile conductive state upon the application of the programming voltage between the power buses when a signal is applied to the input terminal of the inverter of which the non-volatile element is a part;

the output terminal of the first inverter connected to the input terminal of the second inverter to force the second inverter into an opposite conductive state from the conductive state of the first inverter; and a multiplexer having first and second input/output terminals and a common terminal, the multiplexer alternately connecting the first and second input/output terminals to the common terminal in response to the clock signal;

the sequential logic circuit connected to the first input/output terminal of the multiplexer;

the common terminal of the multiplexer connected to the input terminal of the first inverter;

the second input/output terminal of the multiplexer connected to the output terminal of the second inverter;

the multiplexer responding to one cycle of the clock signal to connect a signal from the sequential logic element to the input terminal of the first inverter;

the first and second inverters establishing conductive states according to the signal from the sequential logic element;

the multiplexer responding to the next cycle of the clock signal to connect a signal from the output terminal of the second inverter to the input terminal of the first inverter and to thereby latch the inverters into the conductive states established by the signal from the sequential logic element applied to the first inverter during the preceding cycle of the clock signal;

the latched conductive states of the inverters establishing predetermined stable input signals to the first and second inverters while the programming voltage is applied to the power busses and also establishing a stable output signal from the memory cell after the initial application of power without ancillary circuitry of the integrated circuit to access and select the memory cell for programming or to establish the predetermined non-volatile initial state.

2. A non-volatile memory cell as defined in claim 1 wherein:

each non-volatile element includes an electrically programmable read-only memory device.

3. A non-volatile memory cell as defined in claim 1 wherein:

each non-volatile element includes an electrically programmable electrically erasable read-only memory device.

4. A non-volatile memory cell as defined in claim 1 wherein:

each non-volatile element includes a floating gate transistor which is programmable to have a threshold voltage above a predetermined magnitude and which is erasable to have a threshold voltage below the predetermined magnitude, the floating gate transistor being selectively programmed and erased in response to the programming voltage and the input signal applied to the input terminal of the inverter of which the non-volatile element is a part.

5. A non-volatile memory cell as defined in claim 1 wherein:

the first inverter includes:

a first transistor having a gate connected to the input terminal of the first inverter and a source-drain channel connected between the output terminal of the first inverter and a first one of the power busses, and a second transistor having a gate connected to the input terminal of the first inverter and a source-drain channel connected between the output terminal of the first inverter and a second one of the power busses; and the second inverter includes:

a third transistor having a gate connected to the input terminal of the second inverter and a source-drain channel connected between the output terminal of the second inverter and the first power buss, and a fourth transistor having a gate connected to the input terminal of the second inverter and a source-drain channel connected between the output terminal of the second inverter and the second power buss;

wherein at least one of the first, second, third, and fourth transistors comprises a floating gate transistor.

6. A non-volatile memory cell as defined in claim 5 wherein:

at least one of the first and second transistors, and at least one of the third and fourth transistors is a floating gate transistor.

* * * * *